US006417514B1

(12) United States Patent
Eneim et al.

(10) Patent No.: US 6,417,514 B1
(45) Date of Patent: Jul. 9, 2002

(54) SENSOR/SUPPORT SYSTEM HAVING A STABILIZATION STRUCTURE AFFIXED TO A SIDE OF A PLATFORM OPPOSITELY DISPOSED FROM A SENSOR ASSEMBLY

(75) Inventors: Arthur A. Eneim, Goleta; Adam M. Kennedy, Santa Barbara; Monesh S. Patel, Goleta; Farhad I. Mirbod, Goleta; Janine F. Lambe, Goleta; Kenneth L. McAllister, Goleta; Stephen R. Gibbs, Santa Barbara, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/502,193

(22) Filed: Feb. 10, 2000

(51) Int. Cl.$^7$ .................................................. G01J 5/16
(52) U.S. Cl. .................... 250/352; 250/340; 250/338.1; 250/336.1
(58) Field of Search ................................ 250/352, 340, 250/338.1, 336.1

(56) References Cited

U.S. PATENT DOCUMENTS

| 5,308,980 A | 5/1994 | Barton |
| 5,672,545 A | 9/1997 | Trautt et al. |
| 6,144,031 A | * 11/2000 | Herring et al. ............. 250/352 |

* cited by examiner

*Primary Examiner*—Hung Xuan Dang
(74) *Attorney, Agent, or Firm*—William C. Schubert; Glenn H. Lenzen, Jr.

(57) ABSTRACT

A sensor/support system includes a sensor assembly having a planar radiation detector lying parallel to a reference plane, a readout circuit, and an interconnect joining the radiation detector to the readout circuit. The system further includes a support structure, the support structure having a platform with a first side to which the sensor assembly is affixed and a second side oppositely disposed from the first side. A shim is affixed to the second side of the platform. The shim is made of a shim material different from the detector material and the platform material. The shim reduces the strain in the interconnect when the temperature of the sensor/support system is changed, as compared with the strain in the interconnect in the absence of the stabilization structure. The shim is selected such that an in-plane strain in the interconnect, measured parallel to the reference plane, during a required thermal excursion is less than a maximum strain difference over the thermal excursion for the interconnect material in low-cycle fatigue for a design number of cycles evaluated over the required thermal excursion.

20 Claims, 3 Drawing Sheets

SENSOR/SUPPORT SYSTEM HAVING A STABILIZATION STRUCTURE AFFIXED TO A SIDE OF A PLATFORM OPPOSITELY DISPOSED FROM A SENSOR ASSEMBLY

BACKGROUND OF THE INVENTION

This invention relates to sensor systems that are heated and/or cooled during service, and, more particularly, to a structure that reduces thermal expansion strains between the elements of the sensor assembly.

A sensor assembly receives radiated energy from a scene, and converts that energy into electrical signals for display and/or analysis. Many infrared and other types of sensor assemblies operate most efficiently and reliably when cooled to a cryogenic temperature, such as about the boiling point of liquid nitrogen, 77K, and are operated in a vacuum to provide thermal insulation for the sensor assembly and to avoid condensation of gases such as water vapor on the sensor assembly. To effect these conditions in service, the sensor assembly is mounted on the platform supported on a hollow tube termed a "cold finger", and within an evacuated dewar/vacuum enclosure. The dewar/vacuum enclosure typically includes an insulated vacuum housing having a window through which the sensor views an external scene.

When the sensor is to be used in service, the opposite end of the cold finger is cooled by a cooling device, causing heat to flow out of the cold finger, the platform, and the sensor assembly. After the sensor assembly reaches the required reduced operating temperature, it becomes operational.

In one design, the sensor assembly includes a planar radiation detector and a planar readout circuit joined to the detector in a face-to-face fashion by a plurality of bump interconnects, with the remaining space typically filled by an adhesive such as an epoxy. The radiation detector and the readout circuit are formed of different materials, with different coefficients of thermal expansion. The bumps provide both electrical communication between the detector and the readout circuit, and structural joining. This structure is well known in the art.

The sensor assembly is usually assembled and joined to the platform of the cold finger at about room temperature (300° K.), with negligible strains between the radiation detector and the readout circuit. When the sensor assembly is cooled to the service temperature, differential thermal expansion strains between the radiation detector and the readout circuit arise because of the different coefficients of thermal expansion of the detector and the readout circuit. These differential thermal strains apply stresses to the bump interconnects, which can cause the bump interconnects, and thence the sensor assembly, to fail.

Several approaches have been suggested to overcome this problem. In one, taller bump interconnects are used to allow the bumps to deform, thereby reducing the incidence of failure. This approach is operable for sensor assemblies of small lateral extent, but is of limited usefulness for larger sensor assemblies. In another approach, the epoxy adhesive is omitted, but the resulting structure may have insufficient mechanical strength. In a third approach, different materials have been used in the sensor assembly in an attempt to reduce the thermal expansion mismatch, but the resulting sensor has a reduced operating performance. In a fourth approach, a readout circuit substrate is built into the sensor assembly between the readout circuit and the platform, to alter the thermal expansion properties of the readout circuit so as to be closer to those of the radiation detector. This approach is operable, but the readout circuit substrate also serves as a substantial thermal impedance between the sensor assembly and the cooler, increasing the cooldown time and thence the waiting time before operation of the sensor system can commence. This increased waiting time is unacceptable for some applications. The readout circuit substrate also changes the axial position of the image plane, resulting in physical incompatibility of systems that use the readout circuit substrate and those which do not. The use of the readout circuit substrate also increases the required lengths of wirebonds, making them more susceptible to shock and vibration. The use of the readout circuit substrate therefore may not be recommended for some applications.

Accordingly, there is a need for an approach to reducing the differential thermal expansion strains between the detector and the readout circuit of a sensor assembly which is to be cooled during operation. The present invention fulfills this need, and further provides related advantages.

SUMMARY OF THE INVENTION

The present invention provides a sensor/support structure having reduced differential thermal expansion strains between the detector and the readout circuit of the sensor assembly, and consequently a reduced likelihood of failure and increased service life. The performance of the sensor assembly is maintained at a high level. The present approach does not require any change in the sensor or other materials of construction, the position of the image plane, the wirebond lengths, or the bump heights, with the result that the present approach may be used with sensor assemblies whose structure is already optimized for sensor performance. The cooldown time of the sensor/support structure is not substantially increased as compared with a conventional structure, so that the waiting time between the start of cooldown and the start of operation of the sensor is not substantially lengthened. The present approach is operable in conjunction with sensor/support structures that must be heated and cooled repeatedly, and yields particularly favorable results in such applications.

In accordance with the invention, a sensor/support system comprises a sensor assembly comprising a radiation detector, and a readout circuit joined to the detector, preferably by a plurality of rigid electrical bump interconnects extending between the detector and the readout circuit. The sensor/support system further includes a support structure comprising a platform having a first side to which the sensor assembly is affixed and a second side oppositely disposed from the first side.

A stabilization structure is affixed to the second side of the platform. The stabilization structure is preferably a shim affixed to the second side of the platform remote from the sensor assembly. The stabilization structure reduces the strain in the interconnect when the temperature of the sensor/support system is changed, as compared with the strain in the interconnect when the temperature is changed in the absence of the stabilization structure.

The shim stabilization structure is applied to the side of the platform remote from the sensor assembly, which is a non-vacuum space for most dewars. The shim is not positioned between the sensor assembly and the platform, so that it does not act as a thermal impedance to reduce the cooling rate and lengthen the waiting time to commence operation of the sensor assembly, as is the case for systems utilizing an expansion controlled readout circuit substrate. The structure, materials of construction, and geometry of the sensor assembly are not altered when the present invention is used, so that the sensor assembly may be separately optimized for sensor optoelectronic performance.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
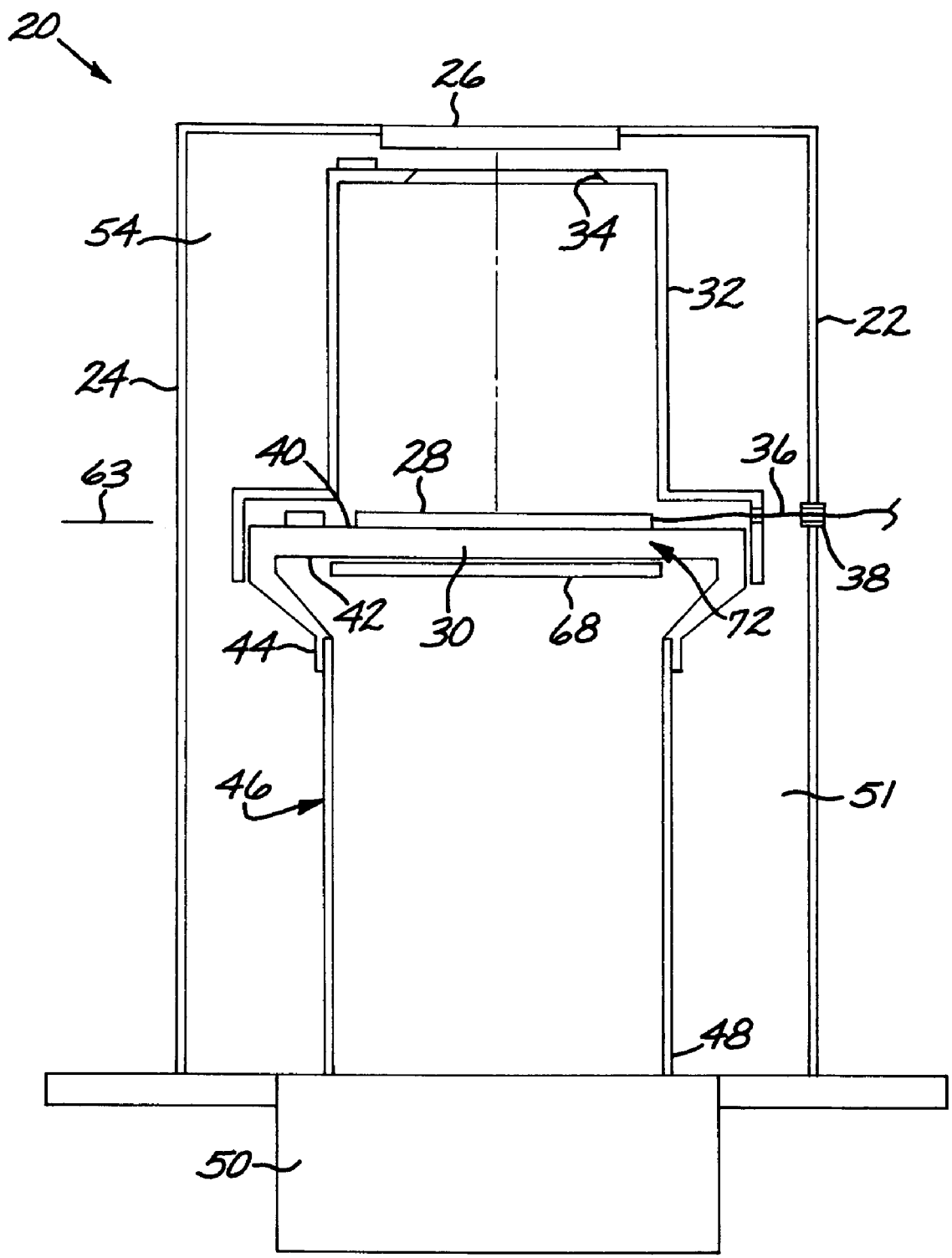
FIG. 1 is a schematic sectional view of a dewar/vacuum enclosure.

FIG. 1 depicts a preferred form of dewar/vacuum enclosure 20 including a dewar body 22 whose interior is evacuated during service. The dewar body 22 has vacuum housing walls 24 with a window 26 in one of the walls 24. A sensor assembly 28 is affixed to a platform 30 in facing relationship to the window 26. The platform 30 may be a single piece of material (as illustrated) or multiple pieces joined together. The platform 30 is typically made of a metal such as titanium or molybdenum, or their alloys. A metal cold shield 32 is affixed to the platform 30 and positioned laterally adjacent to the sensor assembly 28, to prevent extraneous radiation from reaching the sensor assembly 28. The cold shield 32 has an opening 34 therethrough in a line of sight between the sensor assembly 28 and the window 26, so that the sensor assembly 28 views an external scene through the window 26 and the opening 34. The sensor assembly 28 is connected to external instrumentation (not shown) by wires 36, which pass through a feedthrough 38 extending through the wall 24. The material of construction of the window 26 is selected to transmit radiation of the wavelength sensed by the sensor assembly 28, and such windows and window materials are well known in the art for various wavelengths of interest.

The sensor assembly 28 operates most efficiently at reduced temperatures, with the majority of applications at about 77K, the boiling point of liquid nitrogen at atmospheric pressure. To cool the sensor assembly 28 from room temperature (about 300° K.) to the operating temperature, it is affixed onto a first side 40 of the platform 30. An oppositely disposed second side 42 of the platform 30 is bonded to a top end 44 of a hollow, generally cylindrical cold finger 46. The cold finger 46 supports the platform 30 and thence the sensor assembly 28. A bottom end 48 of the cold finger 46, opposite from the top end 44, is cooled by a cooler 50. The cooler 50 produces cooling by any operable approach, such as contact with cold gas and/or a liquefied gas such as liquid nitrogen, or mechanical cooling. A vacuum space 51 within the walls 24 but outside the interior of the volume defined by the cold finger 46 and platform 30 is evacuated to prevent condensation on the sensor assembly 28 and to reduce heat loss from the cold finger 46, the platform 30, and the cold shield 32.

In another cooling approach, which is equivalent for the present purposes, a cooling fluid or a cooling surface may be contacted directly to the second side 42 of the platform 30. In this case, the tube of the cold finger 46 serves to thermally isolate and insulate the sensor assembly 28, the platform 30, and the cold shield 32 from the mounting base.

Figure 2:
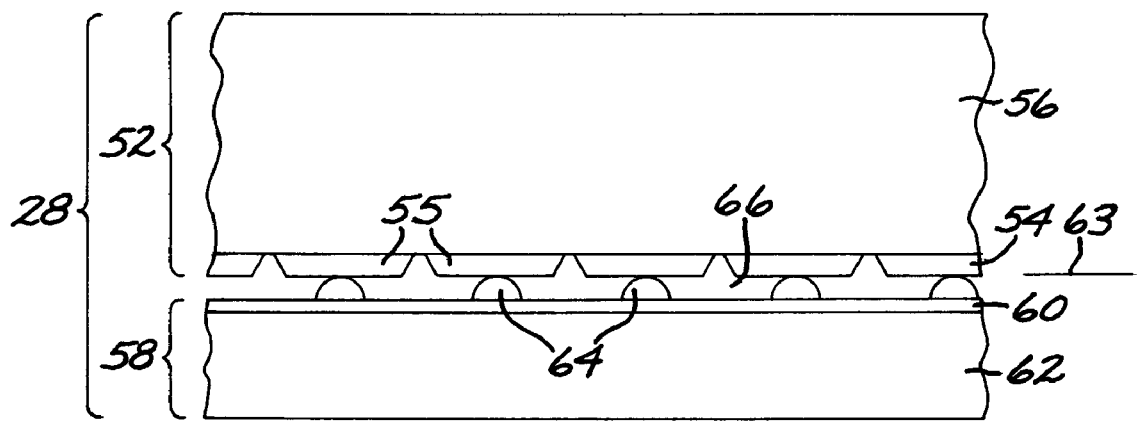
FIG. 2 is a schematic detail view of the sensor assembly.

FIG. 2 depicts the structure of a preferred form of the sensor assembly 28. A radiation detector 52 is formed from a monolithic thin active layer 54 of a material that is sensitive to the radiation wavelength of interest, and which is patterned to form a series of discrete radiation detector elements 55. The active layer 54 of the radiation-sensitive material is typically grown on or affixed to a detector substrate 56 of a material that is transparent to the wavelength of interest, and then patterned and etched to define the radiation detector elements 55. For an infrared detector 52, the active layer 54 may be mercury-cadmium-telluride (HgCdTe) or indium antimonide, and the substrate 56 may be cadmium-zinc-telluride (CdZnTe). A readout circuit 58, formed of a patterned readout layer 60 on a readout substrate 62 is also provided. The pattern of discrete radiation detector elements 55 is matched to the pattern of the circuitry on the readout circuit 58. The readout substrate 62 is typically silicon (Si) with a microelectronic circuit patterned in the readout layer 60. The readout circuit 58 and the detector 52 are each substantially planar, and lie parallel to a reference plane 63.

The discrete radiation detector elements 55 are joined to the readout circuit 58 by a pattern of bumps 64 made of an electrically conductive material such as indium (In). The bumps 64 provide a plurality of local electrical contacts between the discrete radiation detector elements 55 and the readout circuit 58, and also serve as structural elements and supports. Optionally, the space 66 between radiation detector 52 and the readout circuit 58, not otherwise occupied by the bumps 64, may be filed with a structural adhesive such as an epoxy, to further improve the bonding between the radiation detector 52 and the readout circuit 58.

In a typical service application, the entire dewar/vacuum enclosure 20 and the sensor assembly 28 are initially assembled and maintained at room temperature (300° K.). At such time as the sensor assembly 28 is to be used, the cooler 50 is operated to cool the bottom end 48 and thence the top end 44 of the cold finger 46. The platform 30 cools by heat flow to the cold finger 46. The sensor assembly 28 is cooled by conduction of heat into the platform 30 and thence to the cold finger 46 and the cooler 50. In a typical application, the sensor assembly is cooled to the boiling point of liquid nitrogen at 1 atmosphere pressure, about 77° K. As noted earlier, in an approach that is equivalent for the present purposes the cooling may be applied directly to the second side 42 of the platform 30 by inserting the cooler 50 inside the bore of the cold finger 46. The sensor assembly 28 is cooled by conduction of heat into the platform 30 and thence to the cooler 50.

The sensor assembly 28 is pointed toward a scene to be viewed through the window 26. Radiation energy which enters the sensor assembly 28 is converted to electrical energy by the discrete radiation detector elements 55 of the active layer 54. The resulting electrical signals are conveyed by the bumps 64 from the discrete radiation detector elements 55 of the active layer 54 to the readout layer 60, where they are read, processed, and relayed to external instrumentation by the wires 36.

The radiation detector 52 has a coefficient of thermal expansion that is different from that of the readout circuit 58. For example, the coefficient of thermal expansion for CdZnTe is about $4.5 \times 10^{-6}/°$ C., and the coefficient of thermal expansion of silicon is about $1.1 \times 10^{-6}/°$ C. The sensor assembly 28 is typically assembled at room temperature (300° K.). When it is cooled in operation, the different coefficients of thermal expansion result in the production of thermal strains between the radiation detector 52 and the readout circuit 58. These elements 52 and 58 are relatively rigid, so that the stress and strain induced by the thermal strain must be accommodated by the bumps 64. The bumps 64 deform and may fail if the magnitude of the differential thermal strains is sufficiently high, and such failures have often been observed in the past. In service, these assemblies are often thermally cycled many times, up to thousands of times, resulting in low-cycle fatigue failure of the bumps 64 caused by the repetition of the thermal expansion strains, which may be well below the static failure limit. The greatest reliability problems have been experienced during such applications requiring thermal cycling. Conventional assemblies that do not utilize the present approach typically fail after 100–300 thermal cycles, whereas the assemblies that utilize the present approach may be thermally cycled for over 1000 cycles without failure. Various prior techniques described above for alleviating the problem have met with varying degrees of success, but none is fully acceptable for reasons discussed earlier.

In the present invention, a stabilization structure is affixed to the second side 42 of the platform 30. The stabilization structure reduces the strain and stress in the indium bumps 64 caused by the differential thermal expansion between the radiation detector 52 and the readout circuit 58 when the temperature of the sensor/support system is changed, as compared with the differential thermal strain between the radiation detector 52 and the readout circuit 58 in the absence of the stabilization structure. Significantly, the stabilization structure is affixed to the second side 42, which is usually not within the vacuum space 51, and not to the first side 40 to which the sensor assembly 28 is affixed. In some prior approaches, there was an attempt to provide a graded-expansion structure or a compliant structure between the sensor assembly 28 and the platform 30. These approaches either interfered with the functioning of the sensor assembly 28 or reduced the heat flow rate from the sensor assembly 28 to the platform 30 during cooldown, thereby increasing the waiting time to unacceptable levels for operation of the sensor assembly 28 after initiation of cooldown. The waiting times have been on the order of minutes with these prior approaches, when waiting times on the order of seconds are required in many applications. In the present approach, the stabilization structure is on the opposite (second) side of the platform, so that there is very little, if any, interference with the functioning and the cooling of the sensor assembly 28.

The preferred form of the stabilization structure is a shim 68 affixed to the second side 42 of the platform 30. A "shim" is a piece of material, usually in the form of a plate or sheet. The shim 68 is affixed to the second side 42 by any operable technique, preferably an adhesive such as an epoxy. The shim 68 is made of a shim material whose coefficient of thermal expansion is selected to reduce the thermal stresses and strains on the bumps 64. Examples of operable materials for the shim 68 include beryllium copper having a composition in weight percent of approximately 1–2 percent beryllium, 99–98 percent copper, and trace amounts of cobalt, nickel, iron, and lead; silicon (Si); aluminum nitride (AlN); and an iron-nickel alloy such as invar Alloy 36, which has a composition in weight percent of about 36 percent nickel, 0.2 percent silicon, 0.35 percent manganese, 0.2 percent carbon, balance iron, as manufactured by Carpenter Technology, Reading, Pa. In most applications, the coefficient of thermal expansion of the shim material is intermediate between, or greater than, the coefficient of thermal expansion of the detector material and the coefficient of thermal expansion of the platform material. The invention is not so limited, and ther relationships may be appropriate for specific circumstances.

The readout circuit 58, the cold shield 32, the platform 30, and the shim 68 may be viewed as forming a base structure 72. These elements of the base structure 72 are bonded together, so that they expand and contract as an integral unit. The expansion and contraction of the base structure 72 are to be compared with that of the radiation detector 52, which is joined to this base structure by the bumps 64.

A preferred application of the sensor/support system of the invention requires that the device be thermally cycled at least about 3000 times between 300° K. (which is here taken to be room temperature) and 77° K. The inventors have observed that in most cases any failures tend to occur after the assembly has been thermally cycled between 300° K. and 77° K. a number of times. This thermal cycling leads to thermal fatigue of the material of the bumps 64, which is preferably indium metal. Any thermal fatigue failure would therefore likely be of the low-cycle fatigue type.

The shim 68 is designed by the following approach, which is based upon the inventors'observation that failure during repeated temperature excursions in thermal cycling usually occurs by low-cycle fatigue at the bumps 64 due to strain parallel to the reference plane 63 (the "in-plane strain"). First, the in-plane strain experienced by the interconnect (specifically, the bumps 64) $\epsilon_A$ is determined as a function of the selection of the dimensions and material of construction of the stabilization structure (specifically, the shim 68). Second, the in-plane strain experienced at the interconnect is compared with the maximum strain which the material of the interconnect can be subjected to and still survive the required number of thermal excursions without failure. If the strain experienced at the interconnect is less than the maximum strain, the stabilization structure is acceptable. If the strain experienced at the interconnect is equal to or greater than the maximum strain, a different stabilization structure must be selected.

The in-plane strain actually experienced by the interconnect $\epsilon_A$ may be calculated in any operable manner. In a preferred approach, the relevant portions of structure including the radiation detector 52, the interconnect (here, the bumps 64), the readout circuit 58, the cold shield 32, the platform 30, the material in the spaces 66 (if any), and the shim 68 are analyzed to determine the in-plane strain in the bumps 64 as the temperature of the structure is changed. In the preferred case, the temperature excursion is from 300° K. to 77° K., but the approach is operable with other temperature excursions. The $\epsilon_A$ strain calculation is preferably performed by finite-element analysis because of the complexity of the geometry and the materials of construction. Finite-element techniques that may be used for this analysis are well known in the art. The inventors have used the ANSYS finite-element computer program, available commercially from Swanson Analysis Systems, Inc. to calculate the in-plane strains in the bumps 64 for their preferred geometry shown in FIG. 1. In another approach, the radiation detector 52 may be considered the structure on one side of the bumps 64, and the integral base structure 72 may be considered as the structure on the other side of the bumps 64. The strain in radiation detector 52 and the strain in the base structure 72 during the temperature excursion may be individually calculated (typically using a finite-element analysis), and the resulting dimensional change imposed on the bumps 64 to calculate the strain in the bumps.

Figure 4:
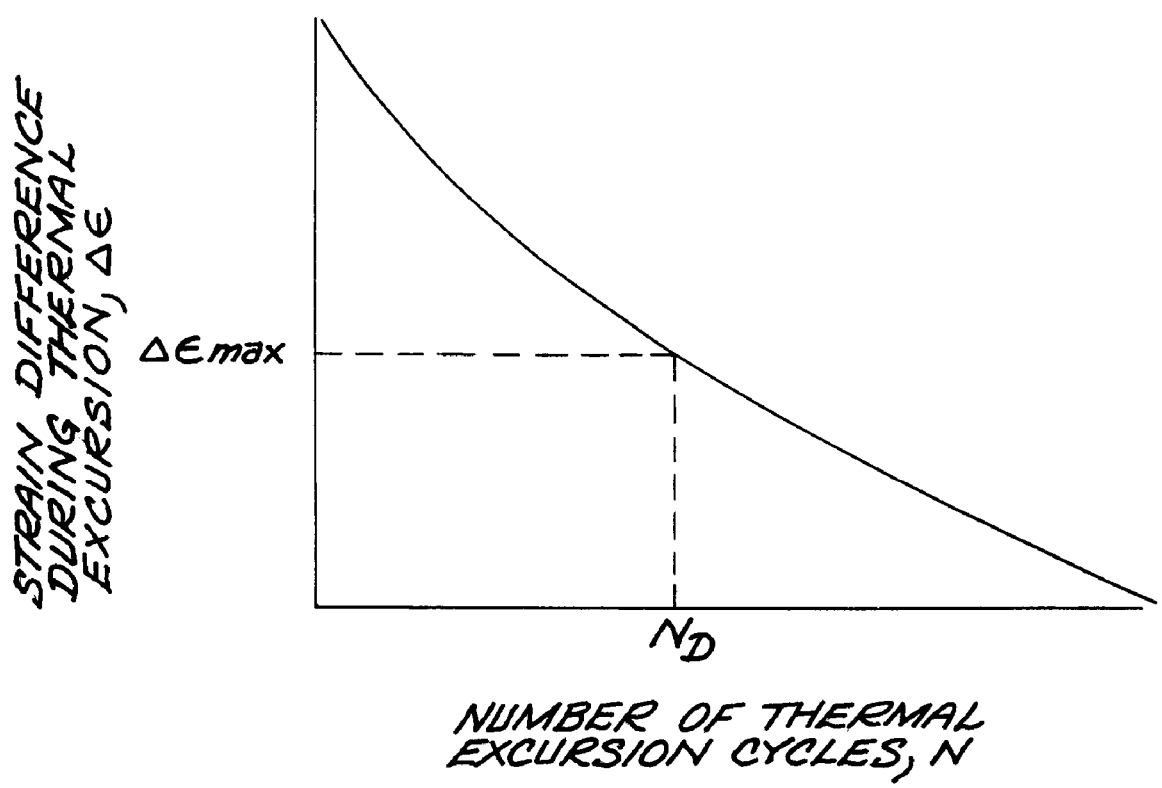
FIG. 4 is an idealized graph of strain difference during a thermal excursion as a function of number of thermal excursion cycles.

Turning to the second step of the analysis, the response of the bumps 64 to the imposed $\epsilon_A$ depends upon their material of construction. Each material of construction has a characteristic response to low-cycle fatigue, which may be measured for the particular material using conventional techniques. FIG. 4 is a representative low-cycle fatigue response curve for the strain range $\Delta\epsilon$ imposed on the material that will lead to failure in N thermal excursion cycles. (Each thermal cycle involves one temperature excursion from the higher to the lower temperature.) The curve of FIG. 4 may be interpreted as indicating a maximum strain difference $\Delta\epsilon_{max}$ that may be present without resulting in failure in $N_D$ cycles. However, if that maximum strain difference $\Delta\epsilon_{max}$ is equaled or exceeded, the structure is expected to fail prior to $N_D$ cycles being reached. The design requirements of the assembly dictate that the structure must survive to $N_D$ cycles (3000 cycles in a case of interest to the inventors), which corresponds to a maximum strain difference of $\Delta\epsilon_{max}$. Thus, the material and thickness of the shim are selected so that the strain $\epsilon_A$ experienced within the bumps 64 will be less than $\Delta\epsilon_{max}$.

In practice, then, the value of $\epsilon_A$ of the structure for a particular geometry and material of construction of the shim 68 is calculated, preferably by finite element analysis. The value of $\Delta\epsilon_{max}$ for the material of construction of the bumps 64 and the required number of thermal cycles $N_D$ is found from a curve like that of FIG. 4, for the specific material of construction of the bumps 64. If $\epsilon_A$ is less than $\Delta\epsilon_{max}$, the structure is expected to survive without failure for at least $N_D$ cycles, and the selected shim 68 would be acceptable. The approach may be supplemented, by using optimization techniques available in many finite-element programs, to minimize $\epsilon_A$ as a function of the geometry, placement, and material of construction of the shim 68. There are limitations in this minimization, however, because not all materials of construction for the shim 68 may be used in the application. The shim material must be relatively low cost, high thermal conductivity, and capable of being bonded to the platform with a bond that will not fail for the $N_D$ cycles.

Figure 3:
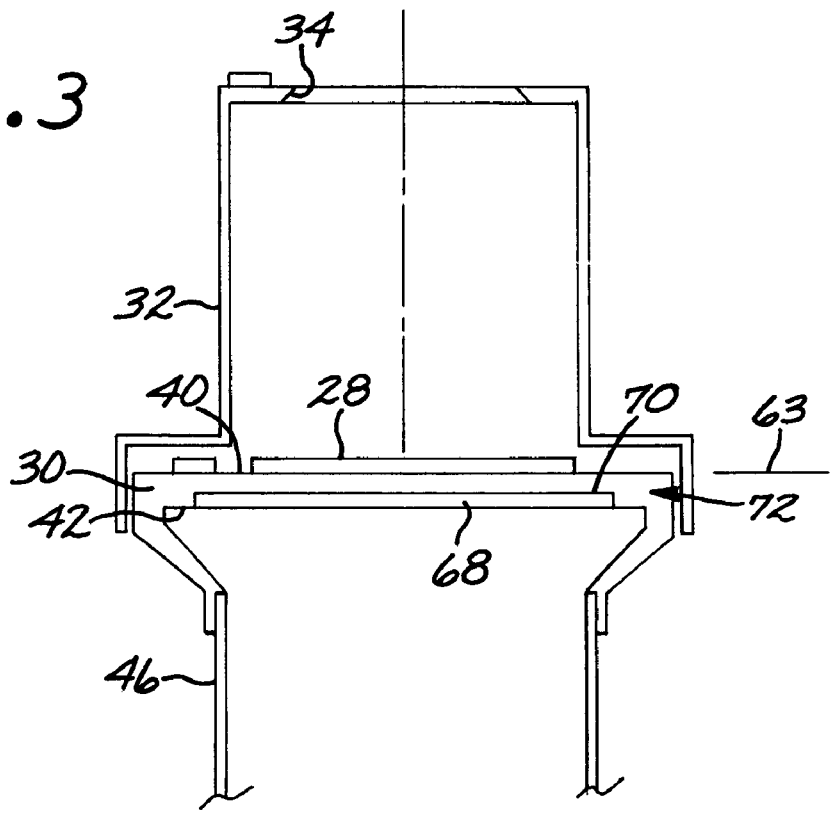
FIG. 3 is a view of a portion of FIG. 1, showing another approach for affixing the shim to the second side of the platform.

By this approach, the inventors have determined that for a conventional geometry of the structure as illustrated in FIGS. 1—3, the strain $\epsilon_A$ permissible for the indium metal bumps 64 to withstand 3000 cycles of low-cycle fatigue is about 0.08, or about 8 percent, when the structure is cycled from 300° K. to 77° K., and thereafter back to 300° K. to repeat the cycle. For this thermal cycling application, if the maximum strain between the base structure 72 and the radiation detector 52 is more than about 8 percent, the structure will fail at the bumps 64 earlier than the life goal of 3000 cycles. In another example, the strain $\epsilon_A$ permissible for the indium metal bumps 64 to withstand 10 cycles of low-cycle fatigue is about 0.40, or about 40 percent, when the structure is cycled from 300° K. to 77° K., and thereafter back to 300° K. to repeat the cycle. In general, the greater the strain difference between the base structure and the radiation detector, the lower the number of cycles to failure. The thickness and material of construction of the shim 68 are selected so that the value of $\epsilon_A$ is less than $\Delta\epsilon_{max}$ for the particular application. No fixed limiting value for the thickness and/or material of construction of the shim may be stated as applicable for all situations, because they depend upon the specific design and materials of construction of the assembly, the thermal excursion, and the material of construction of the bumps.

The shim 68 may be affixed to the second side 42 of the platform 30 in any operable manner, and FIG. 3 shows another embodiment. In FIG. 3, the same reference numerals are used as in prior figures where appropriate, and the prior discussion is incorporated here. In the embodiment of FIG. 3, a recess 70 is cut into the second side 42 of the platform 30, and the shim 68 is affixed to the second side 42 within the recess 70.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A sensor/support system, comprising:
   a sensor assembly comprising
      a radiation detector which is substantially planar and lying parallel to a reference plane, the radiation detector being made of a detector material,
      a readout circuit, and
      an interconnect joining the radiation detector to the readout circuit, the interconnect being made of an interconnect material; and
   a support structure, the support structure comprising
      a platform having a first side to which the sensor assembly is affixed and a second side oppositely disposed from the first side, the platform being made of a platform material,
      a hollow tubular cold finger having a top end bonded to a periphery of the platform and an oppositely disposed bottom end, and
      a shim bonded to the second side of the platform, the shim being made of a shim material different from the detector material and the platform material.

2. The sensor/support system of claim 1, wherein a coefficient of thermal expansion of the shim material is intermediate between a coefficient of thermal expansion of the detector material and a coefficient of thermal expansion of the platform material.

3. The sensor/support system of claim 1, wherein a coefficient of thermal expansion of the shim material is greater than a coefficient of thermal expansion of the detector material and a coefficient of thermal expansion of the platform material.

4. The sensor/support system of claim 1, wherein the shim is selected such that an in-plane strain in the interconnect, measured parallel to the reference plane, during a required thermal excursion is less than a maximum strain difference over a thermal excursion for the interconnect material in low-cycle fatigue for a design number of cycles evaluated over the required thermal excursion.

5. The sensor/support system of claim 4, wherein the interconnect comprises indium, and wherein the maximum strain difference is no greater than about 40 percent, as evaluated in a thermal excursion from 300° K. to 77° K.

6. The sensor/support system of claim 4, wherein the interconnect comprises indium, and wherein the maximum strain difference is no greater than about 8 percent, as evaluated in a thermal excursion from 300° K. to 77° K.

7. The sensor/support system of claim 6, wherein the bump interconnects are made of indium.

8. The sensor/support system of claim 1, wherein the interconnect comprises
   a plurality of rigid electrical bump interconnects extending between the radiation detector and the readout circuit.

9. The sensor/support system of claim 1, wherein the radiation detector comprises at least one material selected from the group consisting of mercury-cadmium-telluride and indium antimonide.

10. The sensor/support system of claim 1, wherein the readout circuit comprises silicon.

11. The sensor/support system of claim 1, wherein the platform comprises a material selected from the group consisting of titanium and molybdenum, and their alloys.

12. The sensor/support system of claim 1, wherein the shim comprises
   a material selected from the group consisting of beryllium-copper, silicon, aluminum nitride, and iron-nickel alloy.

13. The sensor/support structure of claim 1, wherein there is no stabilization structure affixed to the first side of the platform between the platform and the sensor assembly.

14. A sensor/support system, comprising:
   a sensor assembly comprising
      a radiation detector,
      a readout circuit, and
      an interconnect joining the radiation detector to the readout circuit; and
   a support structure, the support structure comprising
      a platform having a first side to which the sensor assembly is affixed and a second side oppositely disposed from the first side,
      a hollow tubular cold finger having a top end bonded to a periphery of the platform and an oppositely disposed bottom end, and
      a stabilization structure affixed to the second side of the platform, the stabilization structure reducing the strain in the interconnect when the temperature of the sensor/support system is changed, as compared with the strain in the interconnect in the absence of the stabilization structure.

15. The sensor/support system of claim 14, wherein the stabilization structure comprises a shim.

16. The sensor/support system of claim 14, wherein the interconnect comprises
   a plurality of rigid electrical bump interconnects extending between the detector and the readout circuit.

17. The sensor/support structure of claim 14, wherein there is no further stabilization structure affixed to the first side of the platform between the platform and the sensor assembly.

18. A sensor/support system, comprising:
   a sensor assembly comprising
      a radiation detector, and
      a readout circuit joined to the detector along a reference plane, and
      a plurality of indium bump interconnects extending between the radiation detector and the readout circuit; and
   a support structure, the support structure comprising
      a platform having a first side to which the sensor assembly is affixed and a second side oppositely disposed from the first side,
      a hollow tubular cold finger having a top end bonded to a periphery of the platform and an oppositely disposed bottom end, and
      a shim bonded to the second side of the platform, wherein a maximum strain in the interconnect measured in the reference plane is less than about 40 percent, as measured in a thermal excursion from 300° K. to 77° K.

19. The sensor/support system of claim 18, wherein the maximum strain is less than about 8 percent.

20. The sensor/support structure of claim 18, wherein there is no stabilization structure affixed to the first side of the platform between the platform and the sensor assembly.

* * * * *